United States Patent
Xue et al.

(10) Patent No.: US 8,848,990 B2
(45) Date of Patent: Sep. 30, 2014

(54) AUTOMATIC REGISTRATION OF IMAGE SERIES WITH VARYING CONTRAST BASED ON SYNTHETIC IMAGES DERIVED FROM INTENSITY BEHAVIOR MODEL

(75) Inventors: Hui Xue, Franklin Park, NJ (US); Saurabh Shah, Chicago, IL (US); Jens Gühring, Erlangen (DE); Andreas Greiser, Erlangen (DE); Christophe Chefd'hotel, Jersey City, NJ (US); Christoph Guetter, Lawrenceville, NJ (US); Marie-Pierre Jolly, Hillsborough, NJ (US); Sven Zuehlsdorff, Chicago, IL (US)

(73) Assignee: Siemens Aktiengesellschaft, Munich (DE)

( * ) Notice: Subject to any disclaimer, the term of this patent is extended or adjusted under 35 U.S.C. 154(b) by 402 days.

(21) Appl. No.: 13/237,198

(22) Filed: Sep. 20, 2011

(65) Prior Publication Data

US 2012/0189183 A1    Jul. 26, 2012

Related U.S. Application Data

(60) Provisional application No. 61/387,147, filed on Sep. 28, 2010.

(51) Int. Cl.
| | | |
|---|---|---|
| *G06K 9/00* | (2006.01) | |
| *G06T 5/50* | (2006.01) | |
| *G06T 7/00* | (2006.01) | |
| *G01R 33/44* | (2006.01) | |
| *G01R 33/565* | (2006.01) | |

(52) U.S. Cl.
CPC ............... *G06T 5/50* (2013.01); *G01R 33/448* (2013.01); *G06T 2207/20201* (2013.01); *G06T 7/0024* (2013.01); *G06T 2207/10088* (2013.01); *G06T 2207/30048* (2013.01); *G01R 33/56509* (2013.01)
USPC ........... 382/128; 382/254; 382/275; 382/294; 600/410

(58) Field of Classification Search
None
See application file for complete search history.

(56) References Cited

U.S. PATENT DOCUMENTS

| | | | | |
|---|---|---|---|---|
| 6,255,818 | B1* | 7/2001 | Heaton et al. | 324/303 |
| 6,823,205 | B1* | 11/2004 | Jara | 600/410 |
| 8,155,729 | B1* | 4/2012 | Hsieh et al. | 600/427 |
| 2001/0009369 | A1* | 7/2001 | Shimo et al. | 324/307 |
| 2002/0107441 | A1* | 8/2002 | Kirsch | 600/410 |
| 2004/0260170 | A1* | 12/2004 | Wood et al. | 600/410 |
| 2005/0190189 | A1* | 9/2005 | Chefd'hotel et al. | 345/501 |

(Continued)

OTHER PUBLICATIONS

Milles et al., "Fully Automated Motion Correction in First-Pass Myocardial Perfusion MR Image Sequences", Nov. 2008, IEEE Transactions on Medical Imaging, vol. 27, No. 11, 1611-21.*

(Continued)

*Primary Examiner* — Matthew Bella
*Assistant Examiner* — Jason Heidemann

(57) ABSTRACT

A method for performing motion compensation in a series of magnetic resonance (MR) images includes acquiring a set of MR image frames spanning different points along an MR recovery curve. A motion-free synthetic image is generated for each of the acquired MR image frames using prior knowledge pertaining to an MR recovery curve. Each of the acquired MR images is registered to its corresponding generated synthetic images. Motion within each of the acquired MR image is corrected based on its corresponding generated synthetic image that has been registered thereto.

18 Claims, 4 Drawing Sheets

(56) References Cited

U.S. PATENT DOCUMENTS

| | | | |
|---|---|---|---|
| 2006/0239585 A1* | 10/2006 | Valadez et al. | 382/275 |
| 2009/0103795 A1* | 4/2009 | Mazaika et al. | 382/131 |
| 2009/0284257 A1* | 11/2009 | Bammer et al. | 324/307 |
| 2010/0145197 A1* | 6/2010 | Stapf et al. | 600/445 |
| 2011/0280456 A1* | 11/2011 | Sussman et al. | 382/131 |

OTHER PUBLICATIONS

Messroghli et al. "Modified Look-Locker Inversion Recovery (MOLLI) for High-Resolution T1 Mapping of the Heart", 2004, Magnetic Resonance in Medicine 52:141-146.*

* cited by examiner (a)

(b)

(c)

(d)

(a)

(b)

AUTOMATIC REGISTRATION OF IMAGE SERIES WITH VARYING CONTRAST BASED ON SYNTHETIC IMAGES DERIVED FROM INTENSITY BEHAVIOR MODEL

CROSS-REFERENCE TO RELATED APPLICATION

The present application is based on provisional application Ser. No. 61/387,147, filed Sep. 28, 2010, the entire contents of which are herein incorporated by reference.

BACKGROUND OF THE INVENTION

1. Technical Field

The present disclosure relates to registration of image series and, more specifically, to methods and systems for automatic registration of image series with varying contrast based on synthetic images derived from intensity behavior model.

2. Discussion of Related Art

T1 (Spin-Lattice or Longitudinal) relaxation time describes the rate that nuclear spins return to equilibrium after excitation. T1 relaxation is an important characteristic in the acquisition of magnetic resonance (MR) imaging as mapping T1 relaxation is particularly effective at differentiating between certain types of tissue such as those that include infarction or ischemia. However, when applied to the imaging of the myocardium, T1 relaxation time may be on the order of 1000 ms at a field strength of 1.5T and this length of time may exceed the typical cardiac cycle which is approximately within the range of 600 ms-1200 ms. Respiratory motion and other patient motion may provide additional challenges as not all patients may be able to adequately hold breath or keep still. Accordingly, it may be difficult to effectively monitor T1 relaxation time of the myocardium in light of the disturbance created by cardiac motion, respiratory motion, and other forms of motion.

SUMMARY

A method for performing motion compensation in a series of magnetic resonance (MR) images includes acquiring a set of MR image frames spanning different points along an MR recovery curve. A motion-free synthetic image is generated for each of the acquired MR image frames using prior knowledge pertaining to an MR recovery curve. Each of the acquired MR images is registered to its corresponding generated synthetic image. Motion within each of the acquired MR image frames is corrected based on its corresponding generated synthetic image that has been registered thereto.

The set of acquired MR image frames may include the myocardium.

The set of MR image frames may include T1 relaxation images and the MR recovery curve may be a T1 recovery curve.

Each of the set of MR image frames may be acquired at a substantially identical point within a cardiac cycle using cardiac gating.

Using prior knowledge pertaining to the MR recovery curve may include generating the synthetic images using a known signal model for the MR recovery curve.

Each of the synthetic images may have similar contrast characteristics to the corresponding acquired MR images.

Registration of the acquired MR images to the corresponding synthetic images may be performed using a partial-differential equation-based non-rigid registration algorithm.

The generation of the synthetic images may be performed using the variational energy-minimization.

The registration of each of the acquired MR images to the corresponding synthetic image may be used to relate each of the original acquired MR images to a common spatial reference. This may result in correcting the motion between original acquired MR images.

A method for performing motion compensation in a series of magnetic resonance (MR) images includes acquiring a set of T1 image frames spanning different points along a T1 recovery curve. A motion-free synthetic image is generated for each of the acquired T1 image frames. Every synthetic image may present similar image contrast characteristic to its corresponding acquired T1 images. Motion in the acquired T1 image frames is corrected by registering to the generated motion-free synthetic images.

The set of acquired T1 image frames may include the myocardium.

The synthetic images may be based on a known signal model for a T1 recovery curve.

The synthetic images may each have similar contrast characteristics to corresponding acquired T1 images.

The synthetic images may be spatially aligned.

Registration of the T1 images to the corresponding synthetic images may be performed using a partial-differential equation-based non-rigid registration algorithm.

The generation of the synthetic images may be performed using variational energy-minimization.

The synthetic images may be merged into a series according to relative location along the T1 recovery curve. Merging the synthetic images relative location along the T1 recovery curve may be performed in accordance with a Modified Look-Locker Inversion (MOLLI) recovery sequence technique.

A system for performing motion compensation in a series of magnetic resonance (MR) images includes an image receiving unit for receiving a set of MR image frames spanning different points along a MR recovery curve. An image processing unit generates a motion-free synthetic image for each of the received MR image frames and registers each of the received MR images to the corresponding synthetic image.

The synthetic images may be generated using a known signal model for the MR recovery curve.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
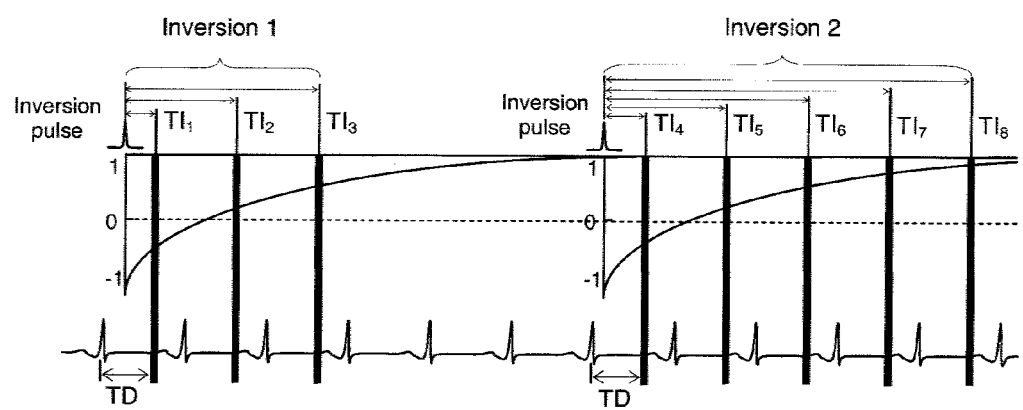
FIG. 1 is a diagram illustrating an approach for combining images as a MOLLI sequence.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention provide various methods and systems for imaging the myocardium by mapping T1 relaxation in light of the challenges posed by cardiac and respiratory motion and various other sources of motion. Technique for mapping T1 relaxation of the myocardium may span multiple cardiac cycles, with various image frames being acquired at various points within the T1 relaxation curve. One such technique is the modified Look-Locker Inversion (MOLLI) recovery sequence. Unlike the standard Look-Locker T1 mapping which constantly samples T1 relaxation (the "recovery curve") after an initial preparation pulse, the MOLLI sequence splits the sampling of the recovery curve across multiple heart beats and performs synchronized acquisition during several cardiac cycles. Then, images selectively acquired at a specific point within the cardiac cycle are merged into a single data set. Sampling of the recovery curve may occur over multiple heartbeats and over multiple preparation pulses and T1 relaxations. Images acquired at the same point in the cardiac cycle and at different points in the recovery curve, across multiple recovery curves, may be combined into a merged image set. Then, the combined images are analyzed to determine the shape of the recovery curve, which may have significant diagnostic value.

FIG. 1 is a diagram illustrating an approach for combining images as a MOLLI sequence. As can be seen, there are two sets of inversions (Look-Locker experiments) spanning two recovery curves. The inversions are performed with increasing inversion time (TI) within one breath-hold. The two images are labeled as "Inversion 1" and "Inversion 2" respectively. A total of 8 images are acquired (3 from Inversion 1 and 5 from Inversion 2), as shown by the vertical bars. Images were acquired with the specific trigger delay (TD) to select the end-diastole. Each R-R interval is measured and the actual values of inversion time (TI) are used for T1-mapping.

Within each inversion, various images are acquired. The images for Inversion 1 are labeled as images $TI_1$, $TI_2$, and $TI_3$. The images for Inversion 2 are labeled as $TI_4$-$TI_8$.

Each image is acquired at a certain predetermined time into the cardiac cycle; for example, at a common trigger delay (TD) to select the end-diastole. As all images are acquired at the same point TD within the cardiac cycle, the effects of cardiac motion may be limited.

The images may then be combined according to their time along the recovery curve to form a single merged image set that shows the level of T1 recovery given the time since the preparation pulse. Here all recovery periods are assumed to exhibit identical recovery curves and it is assumed that the myocardium is at an identical size and position for all times TD into each cardiac cycle. It is also assumed that the patient can maintain a single breath hold over the acquisition of all images and that the patient can remain perfectly still.

In practice, many patients may not be able or willing to maintain a single breath hold for a sufficiently long period of time. For example, patients may be juvenile, elderly, unconscious or otherwise incapacitated. Moreover, while the MOLLI scheme may be able to largely suppress the influence of cardiac motion, the myocardium may not always remain still across all times. Motion may be due to imperfect cardiac gating, subtle changes in heart beat rhythm, and the failure of breath holding. For patients with arrhythmias, it may be particularly difficult to ensure that all images are acquired within the same point in the cardiac cycle.

Figure 2:
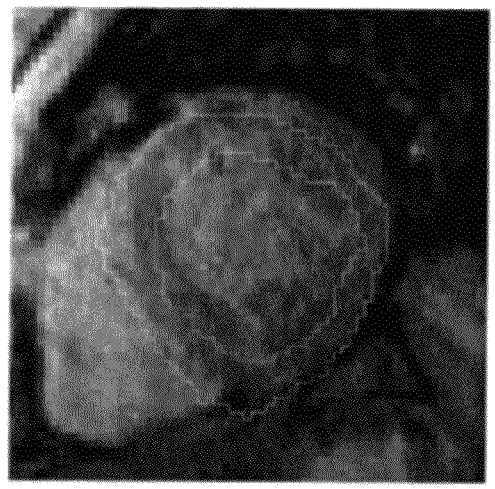
FIG. 2 is a set of sample MR images illustrating myocardium motion across different T1 images.
Figure 2:
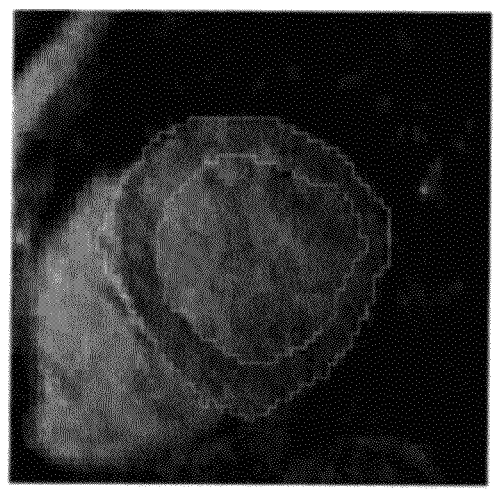
Figure 2:
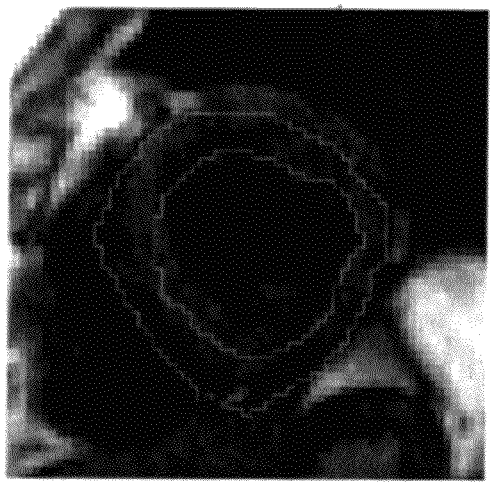
Figure 2:
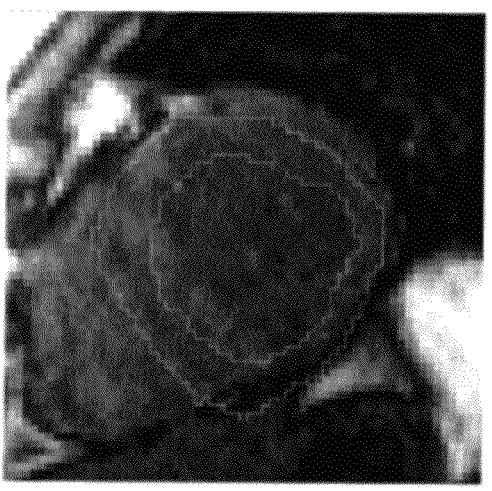

FIG. 2 is a set of sample MR images illustrating myocardium motion across different T1 images. A considerable difference between contrast may be seen between images (a), (b), (c), and (d). For example, regions that appear predominantly white in image (a) appear predominantly black in image (c). Moreover, as may be seen from these images, the myocardium moves away from the middle image over the course of the series. Accordingly as MOLLI techniques may estimate the pixel-wise T1 value, misalignment of pixels may introduce inaccuracy. Direct registration between MOLLI images with significant contrast changes may be prone to failure and accordingly, an unrealistic deformation and/or smearing artifacts may be present.

In FIG. 2, a typical MOLLI acquisition is shown with two inversions. With the contour overlay (extracted from image (b)), it is clear that myocardium motion between heart-beats can be severe. Image registration may be particularly difficult for images acquired close to the signal null-point (e.g. image (c) in this example), where the signal of blood and myocardium are completely inverted compared to other time points.

Accordingly, exemplary embodiments of the present invention may use motion correction for imaging techniques which rely on spatial correspondence of myocardium across multiple images such as MOLLI to maximize clinical applicability. Motion correction may rely on performing image registration from frame to frame. Because image registration may be particularly difficult for image frames with markedly different contrasts, for example, as can be seen from FIG. 2, exemplary embodiments of the present invention seek to provide an approach for registering images to a common spatial reference using a set of synthetic images that are motion-invariant and yet have similar contrast characteristics to their corresponding acquired images.

Figure 3:
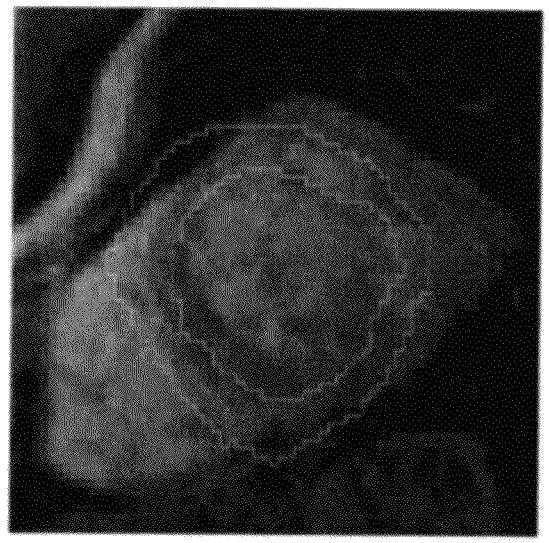
FIG. 3 an exemplary image illustrating mis-registration of the image frames of FIG. 2.
Figure 3:
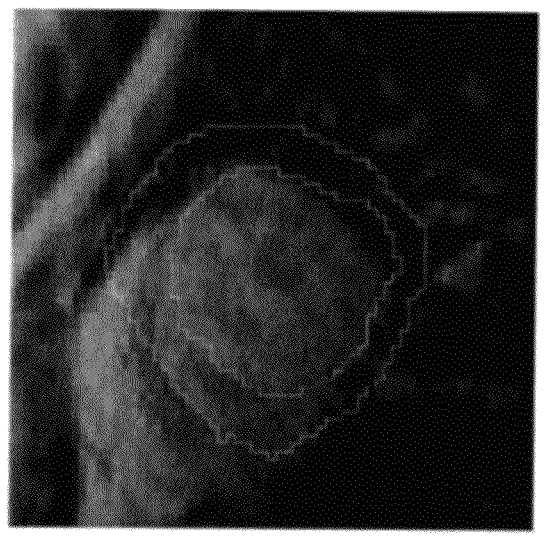

As discussed above, image registration may be particularly difficult for image frames acquired close to the signal null-point, where the signal of blood and myocardium are completely inverted as compared to other time points. This may be seen, for example, in FIG. 3. FIG. 3 is an exemplary image illustrating mis-registration of the image frames of FIG. 2. Here, a partial-differential-equation (PDE) based non-rigid registration algorithm was used to directly register acquired images, however, due to the strong difference in contrast between the image frames, registration was ineffective.

In FIG. 3, failed registration of aligning image (b) of FIG. 2 to image (c) of FIG. 2 is shown. FIG. 3 (a) illustrates failed registration using a cross-correlation approach while FIG. 3 (b) illustrates a failed registration using a mutual information approach. The inverted contrast between blood and myocardium and surround tissues makes the direct registration a difficult task.

Figure 4:
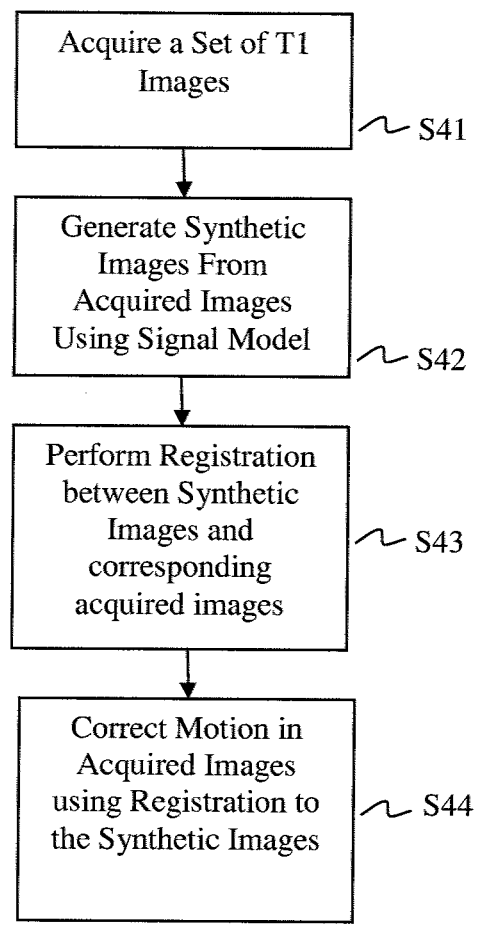
FIG. 4 is a flow chart illustrating a method for performing motion correction for a set of T1 images according to an exemplary embodiment of the present invention.

Exemplary embodiments of the present invention provide methods and systems for performing motion correction for T1 MOLLI images in which motion-free synthetic images may be estimated under the variational energy minimization framework and the T1 recovery signal model. FIG. 4 is a flow chart illustrating a method for performing motion correction for a set of T1 images according to an exemplary embodiment of the present invention. First, a set of real T1 images may be acquired (Step S41). The real T1 images may be images acquired at a common point in the cardiac cycle or at various points in the cardiac cycle. Because exemplary embodiments of the present invention may provide effective motion compensation, cardiac gating may not be necessary. However, cardiac gating may still be used.

The real T1 images may be acquired over a single recovery curve after a single preparation pulse or over a plurality of recovery curves after corresponding preparation pulses. Each of the real T1 images may illustrate a present state of T1 relaxation on the recovery curve and the precise location within the recovery curve may be recorded and associated with the image.

As described above, rather than attempting to directly register one real T1 image to the other, where these images may be acquired at different points along the recovery curve, and may therefore have very different contrast characteristics, a motion-free synthetic image may be estimated for each of the acquired real T1 images (Step S42). The synthetic images may represent a spatially aligned motion-invariant representation of the corresponding real images. Prior knowledge of the signal model may be used to help estimate the motion-free synthetic images.

Each synthetic image may have similar contrast characteristics as the corresponding real image. Accordingly, each real image may be referenced to the corresponding synthetic image for the purposes of registering the real images to the motion-invariant spatial reference.

As discussed above, the synthetic image may be generated using prior knowledge of the signal model. By understanding how to model the signal of the T1 relaxation, this knowledge may be used to estimate how a given real image would appear had it been free of motion. Specifically, the signal of the T1 relaxation can be quantified using an exponential curve according to the physics of magnetic resonance. With this knowledge, it is feasible to compute the signal magnitude for every time point along the T1 recovery curve. This signal model may then be used in the generation of synthetic images.

As the synthetic images may be motion-free, the synthetic images themselves may incorporate motion compensation. In such a case, the synthetic images would be implicitly aligned to a common frame of spatial reference.

It should be understood that the generation of the synthetic image is more than, and in some ways very different from a mere normalization of contrast characteristics. Here, the synthetic image is intended to estimate what the real motion-free version of acquired image would look like. The synthetic image would otherwise appear to have similar characteristics to the original image, including similar contrast characteristics. However, the synthetic image would not be a direct translation of the original image into the common frame of spatial reference and accordingly the synthetic image itself may not be useful for diagnostic purposes. However, the fact that the synthetic image has similar contrast characteristics to the respective real image may be sufficient to aid in converting the real image into the common spatial reference.

The pixel-wise correspondence between each real image and its corresponding synthetic image may be saved so that registration of the synthetic images may be related back to the real image.

After the synthetic images have been generated to match every time points where the real T1 images are acquired along the recovery curve, registration may be performed between the synthetic images and real T1 images (Step S43). By generating synthetic images for one or more of the acquired real images, with each of the synthetic images representing a same time point along the recovery curve, the contrast characteristics of each synthetic image may be similar to the corresponding acquired T1 image and may thus lend themselves to effective registration. Registration may be performed, for example, using a PDE based non-rigid registration algorithm or using any other suitable registration technique. The PDE based non-rigid registration algorithm may not be adequate to register real T1 images to each other due to the markedly changed contrast, it may be very robust to align real images to corresponding synthetic images as the image contrast between real image and synthetic image is similar.

Then, the motion between the real T1 images may be corrected using the registration between each T1 image to its corresponding synthetic image (Step S44). As the synthetic images are presenting similar contrast to corresponding real T1 image, the registration between synthetic image and corresponding real image is robust. As the synthetic images are motion-free, after registering real T1 image to synthetic images, the motion between real T1 images are corrected as well.

Exemplary embodiments of the present invention are not limited to applications involving the generation of synthetic images for T1 relaxation images; rather, exemplary embodiments of the present invention may be applied to register images wherever a signal model is available. For example, exemplary embodiments of the present invention may be applicable to computed tomography (CT) or x-ray images illustrating uptake and/or washout of radiocontrast within coronary arteries or other regions that may be susceptible to motion. Here synthetic images may be generated for real x-ray images to provide a motion-corrected image. Prior knowledge of the uptake/washout curve may be used to produce the synthetic images. Because each synthetic image may illustrate a similar state of uptake/washout as its corresponding real image, registration may be substantially simplified.

Additionally, exemplary embodiments of the present invention may be applied to other modalities of MR imagery such as saturation recovery T1 mapping, T2, and T2*mapping.

As discussed above, the estimation of synthetic images may rely upon a known signal model that may describe how a signal is expected to change over time elapsed since the initial preparation pulse. For example, in the case of T1 relaxation, the signal model may describe how image contrast changes throughout the course of the recovery curve.

Exemplary embodiments of the present invention may utilize a group of N frames $I_n(x,y,t), n=1, 2, N$ as the acquired T1 MOLLI images with different inversion time TI. The synthetic image $M_n(x,y,t), n=1, 2, \ldots N$ may be defined as a function to minimize the following energy functional:

$$M(x, y, t) = \min_M E(M, I, S, w)$$

where the functional E(M,I,S,w) is defined as:

$$E(I, M, S, w) \stackrel{def}{=} E(I(x, y, t), M(x, y, t), S(x, y, t), w(x, y)) \quad \text{(Equation 1)}$$
$$= \int \int_\Omega \int [(I(x, y, t) - M(x, y, t))^2 +$$
$$\alpha \cdot w(x, y) \cdot (M_x^2 + M_y^2) + \beta \cdot$$
$$(S(x, y, t) - M(x, y, t))^2] dx dy dt$$

Here I(x,y,t) is the acquired MOLLI image, and S(x,v,t) is the MOLLI signals which is calculated from the initial T1 parameter fitting and known T1 signal model. For the inversion recovery MOLLI sequence, the signal intensity of a pixel (x,y,t) may be defined by the following three-parameter model:

$$S(x,y,t) = A - B \times \exp(-t/T1^*) \quad \text{(Equation 2)}$$

Here t is the accumulative time from inversion pulse. Note for the inversion recovery sequence, the polarity of acquired magnitude image may be preset to apply the above-mentioned signal model. The weight function w(x,y) may be added to keep the edge sharpness in the estimated synthetic image. This function may be based on the observation that pixels of same tissue type tend to have a similar signal curve. Therefore, w(x,y) is defined as the sum of correlation coefficients between a pixel and its four proximate neighbors. If the weight for a pixel is smaller than a user-defined threshold, it may be set to be zero to completely penalize the any smoothing for this pixel.

In Equation 1, the first term may constrain the distance between synthetic images and original MOLLI images. The second term may be a regularizer and may be added to penalize the occasional errors in the original T1 estimation and keep a sufficient signal-to-noise ratio (SNR) of synthetic image. This term does not constrain the smoothness of the temporal behavior. The last term may be added to minimize the distance between estimated images and MOLLI signal recovery curve. As the MOLLI signal recovery curve (Equation 2) may provide smoothing, the term may implicitly constrain the temporal smoothness of estimated synthetic images.

Following the calculus of variation, the Equation 1 may be minimized by solving the following Euler equation:

$$\alpha \cdot w(x, y) \cdot \left( \frac{\partial^2 M}{\partial x^2} + \frac{\partial^2 M}{\partial y^2} \right) - \\ (1 + \beta) \cdot M(x, y, t) + I(x, y, t) + \beta \cdot S(x, y, t) = 0$$

(Equation 3)

Here the second-order partial derivatives are the natural derivation of regularization item.

Equation 3 may be solved by treating M(x,y,t) as functions of evolution parameter k and solving:

$$\frac{\partial M}{\partial k} \alpha \cdot w(x, y) \cdot \left( \frac{\partial^2 M_k}{\partial x^2} + \frac{\partial^2 M_k}{\partial y^2} \right) - \\ (1 + \beta) \cdot M_k(x, y, t) + I(x, y, t) + \beta \cdot S(x, y, t)$$

(Equation 4)

The steady-state solution of Equation 4 may be the desired solution of the Euler equation. The resulting weights may be used to minimize the energy function defined in Equation 1. Note the Equation 4 belongs to the generalized diffusion equation. The convergence of this kind of equation is theoretically guaranteed if the iteration step Δk is sufficient small.

To stably solve the Equation 4, the second order derivatives may be estimated under the scale-space concepts by convolving the synthetic image $M_k(x,y,t)$ with the second-order derivative of a Gaussian kernel.

Besides the iterative variational solution of the energy minimization problem, the partial differential equation of Equation 3 may be discretized and this may lead to a direct solution as well. Reformat the N frames $I_n(x,y,t), n=1, 2, \ldots, N$ as a 1D vector:

$$\tilde{I}=[I(1,1,1),I(2,1,1),\ldots,I(N_x,1,1),\ldots I(N_x,N_y,1),\ldots \\ I(N_x,N_y,N)]$$

(Equation 5)

Here, $N_x$ is the image size along the x dimension and $N_y$ is the image size along the y dimension. N is the number of images acquired. Similarly, the synthetic and signal images may be converted as $\tilde{M}$ and $\tilde{S}$. In this formulation, the energy function may be written as:

$$\tilde{E}(\tilde{I}, \tilde{M}, \tilde{S}, w) = (\tilde{I} - \tilde{M}) \cdot (\tilde{I} - \tilde{M})^\dagger + \\ \alpha \cdot \sum_{d=1}^{4} (\tilde{M} \cdot D_d) \cdot w_d \cdot (\tilde{M} \cdot D_d)^\dagger + \beta \cdot (\tilde{S} - \tilde{M}) \cdot (\tilde{S} - \tilde{M})^\dagger$$

(Equation 6)

Here the regularizer item is calculated for the four-pixel neighborhood of every pixel.

Minimizing Equation 6 may lead to a system of linear equation:

$$\tilde{M} \cdot \left[ (1 + \beta) \cdot Ind + \alpha \cdot \sum_{d=1}^{4} D_d \cdot w_d \cdot D_d^\dagger \right] = \tilde{I} + \beta \cdot \tilde{S}$$

(Equation 7)

Here, Ind is the identity matrix.

The synthetic image may be computed by applying either Equation 4 or Equation 7. The registration may then be performed between every synthetic image and corresponding MOLLI images. This process may be iteratively performed to further correct all residual motions.

As described above, after the synthetic images have been estimated, motion correction may be performed between every real acquired image and corresponding synthetic image. This process may reduce or eliminate the problem of a drifting myocardium from frame to frame and, as a result, a pixel-wise T1 map without visible motion artifacts may be obtained by performing the non-linear fitting, for example, using a Simplex optimization algorithm.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for performing motion compensation in a series of magnetic resonance (MR) images, comprising:
   acquiring a set of MR image frames spanning different points along an MR recovery curve;
   generating a motion-free synthetic image for each of the acquired MR image frames using variational energy-minimization and prior knowledge pertaining to an MR recovery curve;
   registering each of the acquired MR images to its corresponding generated synthetic image; and
   correcting motion within each of the acquired MR image frames based on its corresponding generated synthetic image that has been registered thereto.

2. The method of claim 1, wherein the set of acquired MR image frames includes the myocardium.

3. The method of claim 1, wherein the set of MR image frames comprise T1 relaxation images and the MR recovery curve is a T1 recovery curve.

4. The method of claim 1, wherein each of the set of MR image frames is acquired at a substantially identical point within a cardiac cycle using cardiac gating.

5. The method of claim 1, wherein using prior knowledge pertaining to the MR recovery curve includes generating the synthetic images using a known signal model for the MR recovery curve.

6. The method of claim 1, wherein each of the synthetic images has similar contrast characteristics to the corresponding acquired MR images.

7. The method of claim 1, wherein registration of the acquired MR images to the corresponding synthetic images is performed using a partial-differential equation-based non-rigid registration algorithm.

8. The method of claim 1, wherein the registration of each of the acquired MR images to the corresponding synthetic image is used to relate each of the original acquired MR images to a common spatial reference, which results in correcting the motion between original acquired MR images.

9. A method for performing motion compensation in a series of magnetic resonance (MR) images, comprising:
   acquiring a set of T1 image frames spanning different points along an T1 recovery curve;
   generating a motion-free synthetic image for each of the acquired T1 image frames;
   correcting for motion in the acquired T1 image frames using the generated motion-free synthetic images; and
   merging the synthetic images into one dataset according to relative location along the T1 recovery curve.

10. The method of claim 9, wherein the set of acquired T1 image frames includes the myocardium.

11. The method of claim 9, wherein the synthetic images are based on a known signal model for a T1 recovery curve.

12. The method of claim 9, wherein the synthetic images each have similar contrast characteristics to corresponding acquired T1 images.

13. The method of claim 9, wherein the synthetic images are spatially aligned.

14. The method of claim 9, wherein registration of the T1 images to the corresponding the synthetic images is performed using a partial-differential equation-based non-rigid registration algorithm.

15. The method of claim 9, wherein merging the synthetic images relative location along the T1 recovery curve is performed in accordance with a Modified Look-Locker Inversion (MOLLI) recovery sequence technique.

16. A method for performing motion compensation in a series of magnetic resonance (MR) images, comprising:
   acquiring a set of T1 image frames spanning different points along an T1 recovery curve;
   generating a motion-free synthetic image for each of the acquired T1 image frames; and
   correcting for motion in the acquired T1 image frames using the generated motion-free synthetic images,
   wherein the generation of the synthetic images is performed using variational energy-minimization.

17. A system for performing motion compensation in a series of magnetic resonance (MR) images, comprising:
   an image receiving unit for receiving a set of MR image frames spanning different points along an MR recovery curve; and
   an image processing unit for generating a motion-free synthetic image for each of the received MR image frames using variational energy-minimization and registering each of the received MR images to the corresponding synthetic image.

18. The system of claim 17, wherein the synthetic images are generated using a known signal model for the MR recovery curve.

* * * * *